(12) United States Patent
Ollila et al.

(10) Patent No.: US 6,781,053 B2
(45) Date of Patent: Aug. 24, 2004

(54) TEST UNIT AND ENCLOSURE FOR TESTING INTEGRATED CIRCUITS

(75) Inventors: Richard W. Ollila, Hillsboro, OR (US); James K. Brence, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/657,584

(22) Filed: Sep. 8, 2003

(65) Prior Publication Data

US 2004/0046584 A1 Mar. 11, 2004

Related U.S. Application Data

(62) Division of application No. 09/706,952, filed on Nov. 6, 2000, now Pat. No. 6,628,131.

(51) Int. Cl.[7] .............................................. H05K 9/00
(52) U.S. Cl. ...................................... 174/35 R; 174/51
(58) Field of Search ............................... 174/35 R, 51; 361/816, 818, 753

(56) References Cited

U.S. PATENT DOCUMENTS

| | | | |
|---|---|---|---|
| 4,326,165 A | 4/1982 | Szedon | 324/158 |
| 5,045,638 A * | 9/1991 | Wada et al. | 174/35 R |
| 5,065,089 A | 11/1991 | Rich | 324/158 |
| 5,220,277 A | 6/1993 | Reitinger | 324/158 |
| 5,749,178 A * | 5/1998 | Garmong | 52/79.1 |
| 5,838,568 A | 11/1998 | Dickinson et al. | 364/468.28 |
| 5,949,682 A | 9/1999 | Dickinson et al. | 364/468.28 |
| 6,114,868 A | 9/2000 | Nevill | 324/760 |

* cited by examiner

Primary Examiner—Hung V. Ngo
(74) Attorney, Agent, or Firm—Schwegman, Lundberg, Woessner & Kluth, P.A.

(57) ABSTRACT

In a die test unit the accumulation of static charge on an enclosure is substantially avoided by fabricating the enclosure to have smooth surfaces coated with a conductive material, insulating the coated or conductive surfaces of the enclosure from the test fixture, and coupling the coated or conductive surfaces to the ground. Any charge that accumulates on the coated or conductive surface of the enclosure is discharged along a conductive path to a reference potential typically formed by a connector, a ground conductor, and a ground. The enclosure supports a substantially laminar air flow over a die by providing a smooth inner surface and two or more vent holes formed about half way between a first end and a second end of the enclosure. The substantially laminar air flow assists in maintaining the air surrounding the die at a substantially constant temperature.

13 Claims, 3 Drawing Sheets

TEST UNIT AND ENCLOSURE FOR TESTING INTEGRATED CIRCUITS

This application is a divisional of U.S. patent application Ser. No. 09/706,952, filed Nov. 6, 2000 now U.S. Pat. No. 6,628,131 which is incorporated herein by reference.

FIELD

The present invention relates to integrated circuits, and more particularly, the present invention relates to testing integrated circuits.

BACKGROUND

Integrated circuits are designed to operate under a variety of environmental conditions. For example, integrated circuits are designed to operate over a range of temperatures. To ensure that an integrated circuit operates correctly over a particular range of temperatures, the integrated circuit is tested at different temperatures within the particular range of temperatures.

FIG. 1 shows a prior art test unit 101 for producing a constant temperature environment in which an integrated circuit can be tested. The test unit 101 includes a constant temperature air source 103, a test fixture 105, and an enclosure 107. A die 109, which includes an integrated circuit, is inserted in the test fixture 105 for electrical testing. The constant temperature air source 103 is capable of providing a stream of constant temperature air to the test fixture 105. The enclosure 107, when inserted between the test fixture 105 and the constant temperature air source 103, provides a cavity 111 in which a constant temperature environment is created. The enclosure 107 is fabricated from stacked foam rubber pads 113, 115, and 117. Each of the foam rubber pads 113, 115, and 117 has a hole such that when the foam rubber pads are stacked, as shown in FIG. 1, the holes are aligned to form the cavity 111. Each of the foam rubber pads 113, 115, and 117 also has one surface 119, 121, and 123, respectively, coated with a conductive material. At least one of the surfaces 119, 121, or 123 is attached to a ground 125.

TABLE 1

Silicone Foam Electrostatic Discharge (ESD) Data

|  | Free Air Decay+ | Free Air Decay− | Ionized Air Decay+ | Ionized Air Decay− |
|---|---|---|---|---|
|  | Coated ½" Silicone Sheet | | | |
| Grounded | 0.1 | 0.1 | 0.1 | 0.2 |
|  | 0.1 | 0.1 | 0.1 | 0.1 |
|  | 0.1 | 0.1 | 0.1 | 0.1 |
|  | 0.1 | 0.1 | 0.1 | 0.1 |
|  | 0.1 | 0.1 | 0.1 | 0.1 |
| Average | 0.1 | 0.1 | 0.1 | 0.12 |
| Ungrounded * | Infinite | Infinite | 172.3 | 207.9 |
|  | Infinite | Infinite | 178.5 | 214.1 |
|  | Infinite | Infinite | 180.7 | 204.5 |
|  | Infinite | Infinite | 180.1 | 198.3 |
|  | Infinite | Infinite | 177.1 | 200.3 |
| Average |  |  | 177.74 | 205.02 |

TABLE 1-continued

Silicone Foam Electrostatic Discharge (ESD) Data

| | Model # | Cal Date | Due Date |
|---|---|---|---|
| Ion Systems Charge Plate | 210 | Jun. 9, 1999 | Jun. 7, 2000 |

Notes:
All tests performed with coated side of foam resting on charged plate.
All grounding done through 1 Meg. Ohm resistor to ground.
Decay test was from +/−5000 volts to +/−100 volts.
All Test Equipment Traceable to NIST.
*Non-Coated Side of silicone foam was charged to about −3K volts when first placed on charge plate.
Coated side of silicone foam was about +5 volts when first placed on charge plate ungrounded.

Table 1 shows electrostatic discharge data for a grounded sheet of silicone foam charged to ±5000 volts in free air and ionized air and an ungrounded sheet of silicone foam charged to ±5000 volts in free air and in ionized air. As can be seen from Table 1, a grounded silicone foam sheet discharges in about 100 milliseconds, and an ungrounded sheet does not discharge in free air and discharges in between about 177 seconds and about 205 seconds in ionized air.

Unfortunately, several problems can occur during the operation of the test unit 101 during the testing of the die 109. First, an electrostatic charge 127 can accumulate on the surfaces 119, 121, and 123 of the enclosure 107, and an electrostatic charge 129 can accumulate on the test fixture 105. The accumulation of electrostatic charge 127 on the enclosure 107 and the accumulation of electrostatic charge 129 on the test fixture 105 can cause currents to flow in the test fixture 105. The currents flowing in the test fixture 105 may damage the die 109 and any electronic circuits (not shown) connected to the test fixture 105. The problem is particularly severe when any of the surfaces 119, 121, or 123 become ungrounded. As shown in the test data in Table 1, the decay time is between about 177 seconds and about 205 seconds for an ungrounded silicone sheet. This long decay time increases the likelihood of the die 109 becoming damaged by electrostatic discharge. Second, since the stacked foam rubber pads 113, 115, and 117 provide an enclosure having poor structural integrity, the location of the pads can change between uses of the test unit 101. A change in pad location makes it difficult to get consistent results when performing repeatability tests using the test unit 101.

For these and other reasons there is a need for the present invention.

DETAILED DESCRIPTION

Figure 1:
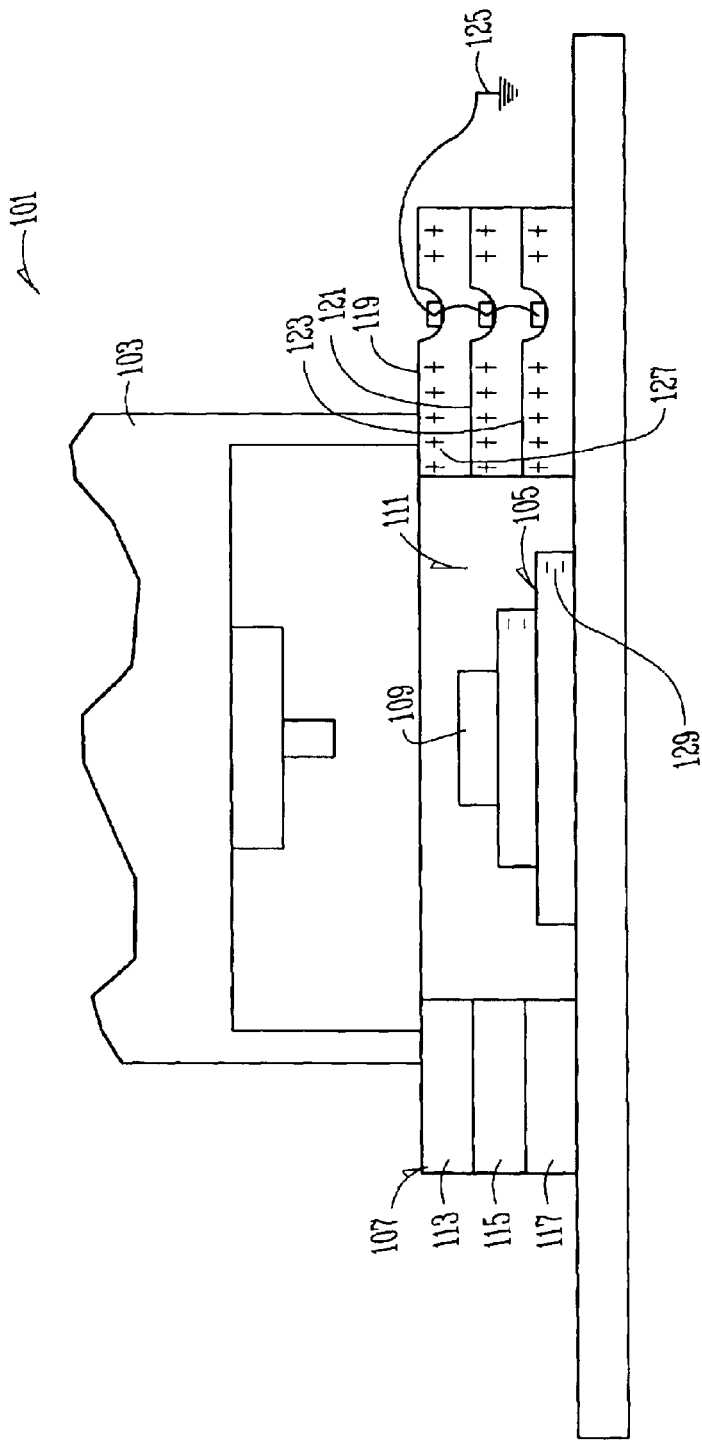
FIG. 1 is an illustration of a prior art test unit.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

Figure 2:
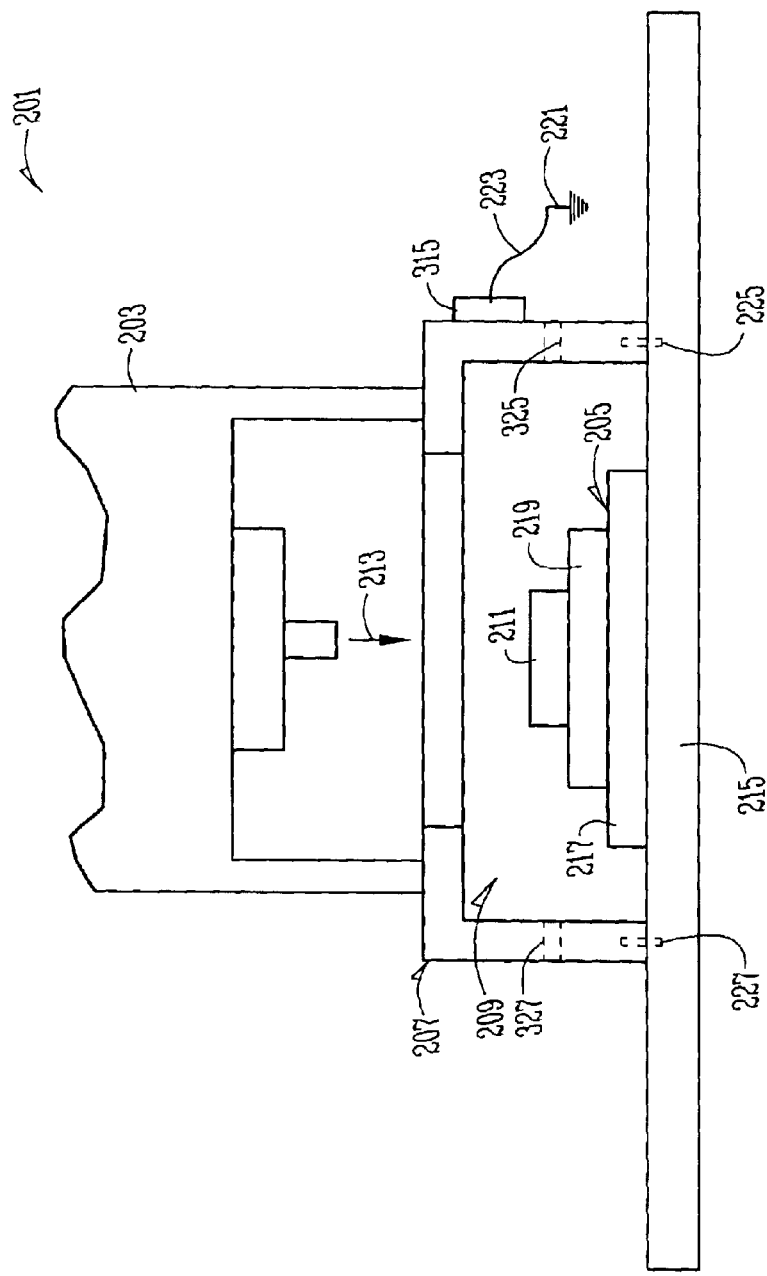
FIG. 2 is an illustration of one embodiment of a test unit according to the present invention.

FIG. 2 is an illustration of one embodiment of a test unit 201 according to the present invention. The test unit 201 includes an air source 203, a test fixture 205, and an enclosure 207. The enclosure 207 is inserted between the air source 203 and the test fixture 205. The test fixture 205, the enclosure 207, and the air source 203 form a cavity 209 in which the test fixture 205 holds a die 211. The enclosure 207 is capable of coupling a substantially constant temperature air stream 213 from the air source 203 to the test fixture 205. As the substantially constant temperature air stream 213 flows into the cavity 209, the enclosure 207 is in operative communication with the substantially constant temperature air stream 213, and the cavity 209 becomes a substantially constant temperature cavity in which circuits formed on the die 211 can be tested.

The air source 203 provides the substantially constant temperature air stream 213 to the die 211 mounted on the test fixture 205. The present invention is not limited to a particular type of temperature controlled air source. Any air source capable of delivering a substantially constant temperature air stream to the die 211 is suitable for use in connection with the present invention. In one embodiment, the substantially constant temperature air stream 213 is an ionized air stream derived from substantially clean, dry air. Substantially clean, dry air refers to air quality typically found in a semiconductor manufacturing facility. Constant temperature air sources are readily available and well known in the art.

The test fixture 205 includes a platform 215, a non-conductive substrate 217, and a socket 219. The die 211 fits into the socket 219. The socket 219 is mounted on the non-conductive substrate 217. The non-conductive substrate 217 is mounted on the platform 215. The platform 215 is preferably fabricated from an insulator, such as fiberglass, and preferably grounded to avoid accumulation of static charge. The non-conductive substrate 217 is preferably fabricated from an insulator, such as fiberglass, typically a composite of glass and plastic, which prevents the socket 219 from being shorted to the platform 215. The platform 215 often includes active circuits, so preventing shorting of the socket 219 to the platform 219 assists in protecting the active circuits from potentially harmful currents. The socket 219 holds the die 211 and couples electronic signals (not shown) to-and-from die 211 for testing circuits formed on the die 211. The electronic signals typically include input signals for stimulating the circuits formed on the die 211 and output signals produced by the circuits formed on the die 211 in response to the input signals.

Figure 3A:
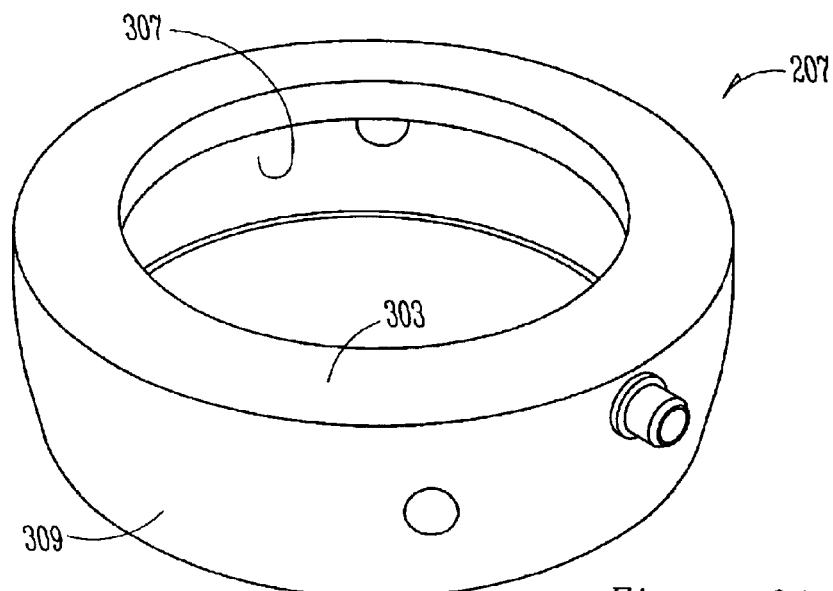
FIG. 3A is a top perspective view of one embodiment of an enclosure suitable for use in connection with the test unit shown in FIG. 2.
Figure 3B:
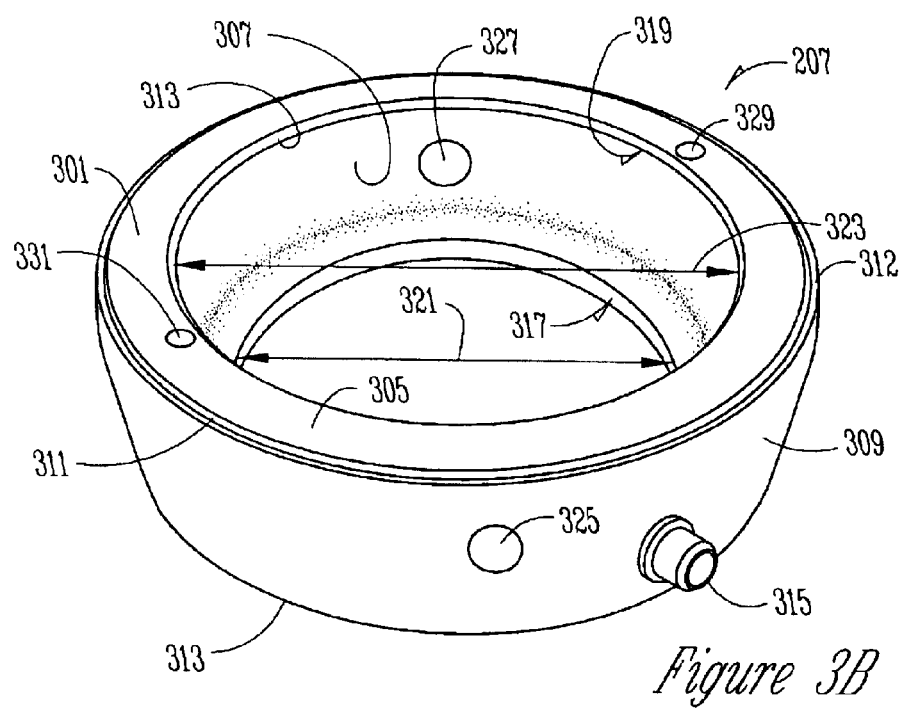
FIG. 3B is a bottom perspective view of one embodiment of the enclosure shown in FIG. 3A.

FIG. 3A is a top perspective view of one embodiment of the enclosure 207 suitable for use in connection with the test unit 201 shown in FIG. 2. FIG. 3B is a bottom perspective view of the enclosure 207. The enclosure 207 comprises a non-conductive core 301 (shown in FIG. 3B) having a plurality of surfaces including a first end 303, a second end 305 (shown in FIG. 3B), an inner surface 307, and an outer surface 309.

The non-conductive core 301 is preferably formed from an easily machinable insulating material. In one embodiment, the non-conductive core 301 is formed from fiberglass. In an alternate embodiment, the non-conductive core 301 is formed from plastic.

The first end 303 provides a surface for coupling or connecting the enclosure 207 to the air source 203 (shown in FIG. 2). The first end 303 is not limited to a particular surface shape. Any surface shape that is capable of coupling or connecting to the air source 203, is suitable for use in connection with the present invention. In one embodiment, the first end 303 has a substantially flat surface. A substantially flat surface is easily manufactured and relatively inexpensive to test when compared to more complex surface shapes.

Referring to FIG. 3B, the second end 305 provides a surface for coupling or connecting the enclosure 207 to the test fixture 205 (shown in FIG. 2). The second end 305 is not limited to a particular surface shape. Any surface shape that is capable of coupling or connecting to the test fixture 205 is suitable for use in connection with the present invention. In one embodiment, the second end 305 is a substantially flat surface. A substantially flat surface allows the enclosure 207 and the test fixture 205 to be easily and quickly assembled.

The second end 305 of the enclosure 207 is preferably an uncoated surface. An uncoated surface is a surface that is not covered with a conductive material. A coated surface is a surface that is substantially covered with a conductive material. In one embodiment, the second end 305 has edges 311 and 313, which are preferably chamfered and uncoated. When the second end 305 is coupled to the test fixture 205 (shown in FIG. 2), any coated or conductive surfaces of the enclosure 207 are insulated from the test fixture 205 by the second end 305 and the edges 311 and 313. Insulating coated or conductive surfaces of the enclosure 207 from the test fixture 205 prevents currents, which can damage the die 211 (shown in FIG. 2) mounted on the test fixture 205, from flowing between the enclosure 207 and the test fixture 205.

The inner surface 307 and the outer surface 309 of the enclosure 207 are preferably coated surfaces. The outer surface 309 and the inner surface 307 are exposed surfaces. An exposed surface is a surface that is not coupled to the air source 203 or the test fixture 205. In one embodiment, the inner surface 307 and the outer surface 309 are substantially smooth surfaces. Substantially smooth surfaces tend to have lower absolute potentials than rough surfaces for the same amount of charge distributed over the surfaces, and therefore substantially smooth surfaces are less likely than rough surfaces to produce currents in the test fixture 205 (shown in FIG. 2) that can damage the die 211 (shown in FIG. 2). Static charge that accumulates on a substantially smooth surface tends to be distributed evenly over the smooth surface. Static charge that accumulates on a rough surface tends to be distributed unevenly over the rough surface and tends to be concentrated at discontinuities, such as edges and peaks. For the same amount of charge distributed on both a rough surface and a smooth surface, the rough surface tends to have higher absolute potentials than the smooth surface because of high charge concentration at the discontinuities.

One or more of the plurality of surfaces including the first end 303, the inner surface 307, and the outer surface 309 on enclosure 207 is preferably a coated surface. In one embodiment, the first end 303, the inner surface 307, and the outer surface 309 of the enclosure 207 are coated surfaces. In one embodiment, the conductive material used to coat the first end 303, the inner surface 307, and the outer surface 309 of the enclosure 207 is a metal. Exemplary metals suitable for use in connection with coating one or more of the plurality of surfaces of the enclosure 207 include but are not limited to aluminum and copper. In an alternate embodiment, the conductive material used to coat one or more of the plurality of surfaces of the enclosure 207 is a semiconductor. The present invention is not limited to a particular process for coating one or more of the plurality of surfaces of the enclosure 207. Exemplary processes suitable for use in applying a conductive material to a surface of the enclosure 207 include painting, spraying, or depositing by chemical vapor deposition.

The coating 312 applied to the non-conductive core 301 provides a conductive surface which, when grounded, prevents accumulation of a potentially destructive static charge on the enclosure 207. Static charge can damage the die 211 (shown in FIG. 2) being tested or associated test electronics (not shown) by inducing currents in the die 211 or the associated test electronics. When grounded, such as through a connection between a connector 315 coupled to the outer surface 309 and a source of reference potential 221, such as a ground potential (shown in FIG. 2), the coated surfaces do not accumulate charge over a long period of time. Any charge that accumulates on the first end 303, the inner surface 307, or the outer surface 309 is discharged to ground through a conductor 223 (shown in FIG. 2) that couples the connector 315 to the source of reference potential 221.

The non-conductive core 301 of the enclosure 207, in one embodiment, is substantially cylindrical and has a first orifice 317 and a second orifice 319. A substantially cylindrical enclosure helps ensure a substantially laminar air flow around the test fixture 205 (shown in FIG. 2) in the cavity 209 (shown in FIG. 2). Turbulence is low and the air flow is substantially laminar because air flow in the cavity 209 is not impeded by discontinuities on the inner surface of the non-conductive core 301. The first orifice 317 is preferably shaped to easily couple to the air source 203 (shown in FIG. 2) and to provide a path from the air source 203 to the die 211 (shown in FIG. 2) mounted on the test fixture 205. The second orifice 319 is shaped to be easily manufacturable and to surround the test fixture 205. In one embodiment, the first orifice 317 is substantially circular having a first diameter 321, and the second orifice 319 is substantially circular having a second diameter 323. The first diameter 321 is preferably less than the second diameter 323. In one embodiment, the first diameter is about 4.5 inches.

FIG. 3B is a bottom perspective view of one embodiment of the enclosure 207 suitable for use in connection with the test unit 201 shown in FIG. 2. As shown in FIG. 3B, the enclosure 207 includes vent holes or orifices 325 and 327, locating holes 329 and 331, and the connector 315.

The vent holes 325 and 327 are formed in the enclosure 207 to provide a path for air to exit the enclosure 207 and to assist in controlling the temperature of the air at the die 211 (shown in FIG. 2). In one embodiment, the vent holes 325 and 327 are formed in the enclosure 207 about half-way between the first end 303 (shown in FIG. 3A) and the second end 305. Forming the vent holes about half-way between the first end 303 and the second end 305 tends to produce a generally laminar air flow over the die 211. A generally laminar air flow over the die 211 provides a more stable temperature environment than a turbulent air flow. The relative positioning of the vent holes 325 and 327 also assists in producing a generally laminar air flow over the die 211. In one embodiment, the vent holes 325 and 327 are located opposite from one another.

The locating holes 329 and 331 are formed on the second end 305 of the enclosure 207. Providing locating holes 329 and 331 on the second end 305 of the enclosure 207 permits repeatable positioning the enclosure 207 on the test fixture 205 (shown in FIG. 2) by allowing alignment of the locating holes 329 and 331 with locating pins 225 and 227 (shown in FIG. 2) on the test fixture 205. Repeatable positioning of the enclosure 207 on the test fixture 205 permits the test unit 201 to perform temperature testing of the die 211 at different times under substantially the same test conditions. The enclosure 207 is not limited to having a particular number of locating holes. However, two locating holes allow for repeatable positioning of the enclosure 207 and require only a small number of manufacturing steps in fabricating the enclosure 207. The small number of manufacturing steps helps to maintain a low manufacturing cost for the enclosure 207.

The connector 315 provides an attachment point on a conductive surface of the enclosure 207 for attaching a ground conductor 223 (shown in FIG. 2). The ground conductor 223 is also attached to the source of reference potential 221 (shown in FIG. 2). The present invention is not limited to a particular type of connector. In one embodiment, the connector 315 is a snap-on connector, which permits the test unit 201 to be easily assembled and disassembled. In an alternate embodiment, the connector 315 is a screw. Exemplary ground conductors suitable for use in attaching the connector 315 to the source of reference potential 221 include single and multiple strand metal wires having snap-on connectors attached at the ends of the metal wire. In one embodiment, the metal wire is a copper wire. In an alternate embodiment, the metal wire is a gold wire.

TABLE 2

Enclosure Electrostatic Discharge (ESD) Data

| | Free Air Decay+ | Free Air Decay− | Ionized Air Decay+ | Ionized Air Decay− |
|---|---|---|---|---|
| | Coated Enclosure | | | |
| | Seconds | Seconds | Seconds | Seconds |
| Grounded Enclosure | 0.1 | 0.1 | 0.1 | 0.2 |
| | 0.1 | 0.1 | 0.1 | 0.1 |
| | 0.1 | 0.1 | 0.1 | 0.1 |
| | 0.1 | 0.1 | 0.1 | 0.1 |
| | 0.1 | 0.1 | 0.1 | 0.1 |
| Average | 0.1 | 0.1 | 0.1 | 0.12 |
| Ungrounded Enclosure | Infinite | Infinite | 42.7 | 43.7 |
| | Infinite | Infinite | 42.4 | 44.1 |
| | Infinite | Infinite | 42.3 | 43.9 |
| | Infinite | InfInite | 42.9 | 42.3 |
| | Infinite | InfInite | 41 | 42.5 |
| Average | | | 42.26 | 43.3 |
| | Uncoated Enclosure | | | |
| Grounded Enclosure | Infinite | Infinite | 63.8 | 67.9 |
| | Infinite | Infinite | 62.5 | 66.1 |
| | Infinite | Infinite | 61.3 | 64.5 |
| | Infinite | Infinite | 59.5 | 65.7 |
| | Infinite | Infinite | 62.9 | 63.1 |
| Average | | | 62 | 65.46 |
| Ungrounded Enclosure * | Infinite | Infinite | 65.6 | 65.7 |
| | Infinite | Infinite | 59.3 | 63.7 |
| | Infinite | Infinite | 59.1 | 61.5 |
| | Infinite | Infinite | 58.1 | 62.9 |
| | Infinite | Infinite | 58.7 | 61.7 |
| Average | | | 60.16 | 63.1 |

TABLE 2-continued

Enclosure Electrostatic Discharge (ESD) Data

| | Model # | Cal Date | Due Date |
|---|---|---|---|
| Ion Systems Charge Plate | 210 | Jun. 9, 1999 | Jun. 7, 2000 |

Notes:
All enclosure grounding done through 1 Meg. Ohm resistor to ground.
Decay test was from +/−5000 volts to +/−100 volts.
All Test Equipment Traceable to NIST.
*Non-Coated Unit was charged to about +800 volts when first placed on charge plate ungrounded.
Coated Unit was about +5 volts when first placed on charge plate ungrounded.

Table 2 shows electrostatic test data for coated and uncoated grounded enclosures and test data for coated and uncoated ungrounded enclosures as measured by the inventors. As can be seen in Table 2, the decay time for an ungrounded coated enclosure in ionized air is between about 42 and about 43 seconds, which is significantly better than the decay time for an ungrounded silicone foam sheet, which is between about 177 and about 205 seconds, as shown in Table 1. The magnitude of the difference between the ungrounded performance of the foam silicone sheet and the enclosure 207 was not well understood prior to the work of the inventors.

Referring again to FIG. 2, in operation, the substantially constant temperature air stream 213 provided by the air source 203 is coupled to the enclosure 207. The enclosure 207 supports a substantially laminar air flow over the die 211 by providing a smooth inner surface and vent holes 325 and 327 formed about half way between the first end 303 and the second end 305 of the enclosure 207. The substantially laminar air flow assists in maintaining the air surrounding the die 211 at a substantially constant temperature, so the die 211 can be tested at the substantially constant temperature. The accumulation of static charge on the enclosure 207 is substantially avoided by fabricating the enclosure 207 to have smooth surfaces coated with a conductive material, insulating the coated or conductive surfaces of the enclosure 207 from the test fixture 205, and coupling the coated or conductive surfaces to the source of reference potential 221. Any charge that accumulates on a coated or conductive surface of the enclosure 207 is discharged along a conductive path to ground typically formed by the connector 315, the ground conductor 223, and the source of reference potential 221.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. An enclosure comprising:
a hollow substantially cylindrical insulating core having a first orifice having a first diameter and at least one further orifice, the first orifice constructed and arranged for coupling the interior of the insulating core to a temperature controlled air source and a second orifice constructed and arranged for allowing air entering the core through the first orifice to pass over a test fixture substantially enclosed within the core prior to exiting through the further orifice, the hollow substantially cylindrical insulating core being partially coated with a conductive material maintained at a reference potential relative to the test fixture.

2. The enclosure of claim 1, wherein the hollow substantially cylindrical insulating core comprises fiberglass.

3. The enclosure of claim 1, wherein the first diameter is about 4.5 inches.

4. The enclosure of claim 1, wherein the conductive material comprises a semiconductor.

5. The enclosure of claim 1, wherein the conductive material comprises a metal.

6. The enclosure of claim 5, wherein the metal comprises copper.

7. The enclosure of claim 1, wherein the enclosure has at least two uncoated chamfered edges.

8. A method of fabricating an enclosure, the method comprising:
forming a cylindrically shaped block of insulating material having a substantially flat first end, a substantially flat second end, and an outer surface;
forming a first hole having a first diameter in the cylindrically shaped block to form a first inner surface;
forming a second hole having a second diameter in the cylindrically shaped block to form a second inner surface, the second diameter being greater than the first diameter; and
coating the outer surface, the substantially flat first end, the first inner surface, and the second inner surface with a conductive material.

9. The method of claim 8, wherein coating the outer surface, the first end, the first inner surface, and the second inner surface with a conductive material comprises:
coating the outer surface, the first end, the first inner surface and the second inner surface with aluminum.

10. The method of claim 9, wherein coating the outer surface, the first end, the first inner surface and the second inner surface with aluminum comprises:
depositing the aluminum on the outer surface, the first end, the first inner surface and the second inner surface by chemical vapor deposition.

11. The method of claim 8, wherein coating the outer surface, the first end, the first inner surface, and the second inner surface with a conductive material comprises:
coating the outer surface, the first end, the first inner surface and the second inner surface with a semiconductor.

12. The method of claim 11, wherein coating the outer surface, the first end, the first inner surface and the second inner surface with a semiconductor comprises:
painting the semiconductor on the outer surface, the first end, the first inner surface and the second inner surface.

13. The method of claim 11, wherein coating the outer surface, the first end, the first inner surface and the second inner surface with a semiconductor comprises:
spraying the semiconductor on the outer surface, the first end, the first inner surface and the second inner surface.

* * * * *